United States Patent
Lee et al.

(10) Patent No.: US 9,758,893 B2
(45) Date of Patent: Sep. 12, 2017

(54) ELECTROPLATING METHODS FOR SEMICONDUCTOR SUBSTRATES

(71) Applicant: APPLIED MATERIALS, INC., Santa Clara, CA (US)

(72) Inventors: Sam K. Lee, Kalispell, MT (US); Charles Sharbono, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 456 days.

(21) Appl. No.: 14/222,407

(22) Filed: Mar. 21, 2014

(65) Prior Publication Data

US 2015/0225866 A1   Aug. 13, 2015

Related U.S. Application Data

(60) Provisional application No. 61/937,370, filed on Feb. 7, 2014.

(51) Int. Cl.
| | |
|---|---|
| C25D 5/48 | (2006.01) |
| C25D 5/02 | (2006.01) |
| C25D 7/12 | (2006.01) |
| C25F 3/02 | (2006.01) |
| C23C 18/16 | (2006.01) |
| H01L 21/768 | (2006.01) |
| C25F 3/16 | (2006.01) |
| H01L 21/288 | (2006.01) |
| H01L 21/321 | (2006.01) |

(52) U.S. Cl.
CPC ............ *C25D 5/48* (2013.01); *C23C 18/1689* (2013.01); *C25F 3/02* (2013.01); *C25F 3/16* (2013.01); *H01L 21/2885* (2013.01); *H01L 21/32115* (2013.01); *H01L 21/7684* (2013.01); *H01L 21/76898* (2013.01); *C25D 5/022* (2013.01); *C25D 7/12* (2013.01)

(58) Field of Classification Search
CPC ..... C25F 3/12; C25F 3/02; C25D 3/58; C25D 3/38; C25D 7/12; C25D 7/123
See application file for complete search history.

(56) References Cited

U.S. PATENT DOCUMENTS

| | | | |
|---|---|---|---|
| 6,224,737 B1 * | 5/2001 | Tsai | C25D 3/38 205/123 |
| 6,399,479 B1 | 6/2002 | Chen et al. | |
| 6,517,894 B1 | 2/2003 | Hongo et al. | |
| 6,699,380 B1 * | 3/2004 | Chen | C23C 18/1632 204/198 |

(Continued)

OTHER PUBLICATIONS

Bunshah, et al., Rointan Framroze, "Deposition Technologies for Films and Coatings", Noyes Publications, pp. 506, 518-525, 530-535 (1982).

Primary Examiner — Brian W Cohen
(74) Attorney, Agent, or Firm — Perkins Coie LLP; Kenneth H. Ohriner

(57) ABSTRACT

A non-uniform initial metal film is non-uniformly deplated to provide a more uniform metal film on a substrate. Electrochemical deplating may be performed by placing the substrate in a deplating bath formulated specifically for deplating, rather than for plating. The deplating bath may have a throwing power of 0.3 or less; or a bath conductivity of 1 mS/cm to 250 mS/cm. Reverse electrical current conducted through the deplating bath non-uniformly. electro-etches or deplates the metal film.

15 Claims, 1 Drawing Sheet

(56) References Cited

U.S. PATENT DOCUMENTS

| | | | |
|---|---|---|---|
| 6,750,144 B2 * | 6/2004 | Taylor | C25D 5/18 |
| | | | 205/101 |
| 6,863,795 B2 | 3/2005 | Teerlinck et al. | |
| 7,247,558 B2 * | 7/2007 | Basol | H01L 21/2885 |
| | | | 257/E21.175 |
| 7,582,564 B2 * | 9/2009 | Wang | B23H 5/08 |
| | | | 252/79.1 |
| 2002/0033341 A1 | 3/2002 | Taylor et al. | |
| 2002/0038764 A1 | 4/2002 | Taylor et al. | |
| 2002/0056645 A1 | 5/2002 | Taylor et al. | |
| 2009/0095637 A1 * | 4/2009 | Toma | H01L 21/32125 |
| | | | 205/640 |

* cited by examiner

ELECTROPLATING METHODS FOR SEMICONDUCTOR SUBSTRATES

This Application claims priority to U.S. Provisional Patent Application No. 61/937,370 filed Feb. 7, 2014 and incorporated herein by reference.

TECHNICAL FIELD

The field of the invention is electroplating semiconductor material substrates or wafers, and similar types of substrates.

BACKGROUND

Metallization of electrical connections has been widely used in many semiconductor applications, ranging from dual damascene to various packaging structures including C4 bumping, pillars, micro-bumps, redistribution layers (RDL), thru-silicon vias (TSV), etc. Such metallization is commonly carried out using techniques such as electro-deposition and electro-less deposition of different metals, such as copper, gold, nickel, solder, and others. As technology advances, the chip layout increasingly has features and pattern density that are difficult to plate or metallize uniformly.

Electro-deposition of advanced microelectronic device packaging often uses a mask or a photoresist layer to define the pattern of metal lines or contacts. The pattern can also be defined by non-reacting or non-conducting surfaces. As used here, the term patterned substrate means a substrate having a mask or photoresist layer or non-reacting or non-conducting regions. The pattern density may vary between sparsely patterned regions and densely patterned regions. This causes corresponding variations in local current density and ion concentration differences, which affect deposition thickness uniformity within a die (the so-called within die non-uniformity, or WID non-uniformity).

One technique for improving thickness uniformity or thickness levelling is to reduce the applied current density overall. Alternatively, a plating bath with high throwing power may be used. Throwing power can be defined as the ability of a plating bath to produce deposits of more or less uniform thickness on cathodes having macroscopic irregularities. The higher the throwing power, the more uniform the resulting deposit. In the case of a copper-acid bath, for example, a common bath formulation with high throwing power would be one with low copper concentration and high acid concentration. Another alternative to reducing current density in a high throwing power bath is to use a periodic reverse current waveform. However, improved plating techniques are needed.

SUMMARY

Methods are provided for improving plating thickness uniformity and planarity. In one aspect, a method includes providing a plated patterned substrate and then electro-etching or deplating the substrate. The plated patterned substrate may be formed on the substrate via electroplating, electro-less plating, or via another liquid or vapor phase thin film deposition technique, collectively referred to here as plating. The deplating step deplates the substrate non-uniformly. The deplating bath may have a low throwing power, and or a low conductivity, to exaggerate the local current density in the sparse regions. The deplating step may preferentially remove some of the plated film from regions of the substrate having a thicker initial film or layer, so that after the deplating step, the substrate has a more uniform deposited metal film.

DETAILED DESCRIPTION

Figure 1:
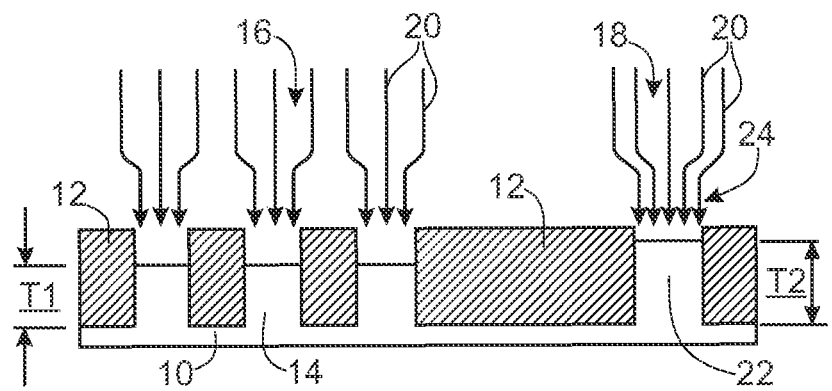
FIG. 1 is a schematic diagram of a substrate during plating.

Electroplating including a deplating step is well known. In these methods, a reverse current waveform may be periodically applied during the plating process, to try to improve plating results. The deplating is performed with the substrate remaining in the plating bath, so that the same bath is used for plating and deplating. Consequently, the uniformity of the deplating step is similar to the plating step. The inventors have discovered, however, that improved results may be obtained via non-uniform deplating, i.e., by removing plated metal from the substrate in a non-uniform manner, and/or in a manner unrelated to how the metal was initially plated onto the substrate.

A typical process may include the following steps:

Providing a patterned plated substrate. The substrate may be a silicon wafer plated with an initial patterned copper film, although other types of substrates and metals may be used. The patterning affects current density during plating so that the initial plated film is non-uniform to a degree. For example, the initial film may be at least 3, 5, 8 or 10% non-uniform (per three sigma/mean). The initial metal film can be formed in various ways, such as electrochemical deposition (plating), electro-less deposition, chemical or physical vapor deposition.

a) Moving the plated substrate into a deplating bath adapted for non-uniform deplating. For example the deplating bath may have a low throwing power, such as a throwing power less than 0.3. Alternatively, the deplating bath may have a low conductivity, for example, 1 mS/cm to 250 mS/cm, or from 10 mS/cm to 100 mS/cm.

b) Partially electro-etching or deplating the plated substrate in deplating bath by conducting reverse electrical current through the substrate and the bath. The deplating step is non-uniform. It removes metal from protrusions faster than from surrounding areas. The remaining metal film is consequently made more uniform. The initial non-uniformity may be reduced by at least 30%. Test data using copper plated onto a 300 mm silicon wafer shows a reduction in non-uniformity of about 60%. This step may performed by any form of electrochemical removal, such as etching, polishing, refining, milling, roughening, brightening, smoothing, passivating, etc.

c) The deplated substrate may be rinsed and dried, and/or then moved for additional chemical or electrochemical processing.

The terms "wafer", "workpiece" and "substrate" are used here interchangeably. The substrate may have various shapes, sizes, and materials. The present methods may be used in plating copper, as well as other metals such as silver, gold, nickel, cobalt, palladium, etc.

A patterned substrate refers to a substrate that has a photoresist or mask layer that defines a pattern. Alternatively, a patterned substrate may refer to a substrate that contains structures already patterned, such as a redistribution layer after photoresist removal, or through-silicon via (TSV) layer after electroplating. Although patterning on a substrate is often the source of plated film non-uniformity, the present methods may be used to provide a more uniform plated film, regardless of the source of the non-uniformity in the initial plated film.

The conventional approach in obtaining a patterned uniform metal film in electroplating is to electroplate the substrate in a high throwing power bath, with suitable additives, and to operate an optimized waveform at an appropriate current density to promote film thickness uniformity over sparse (or isolated) and dense regions of the within-die pattern. Low throwing power is conventionally considered an undesirable property in electroplating for uniform plating.

The present methods use a different approach. In one embodiment, the substrate may be first intentionally plated to a thickness far above the final desired or target thickness, for example 10% or 20% greater than the target thickness. The substrate is then deplated in a low throwing power or low conductivity deplating bath to achieve final film thickness and uniformity. Reversing polarity current in the deplating bath causes preferential or selective metal removal or etching. The result after deplating is a film with improved uniformity. Since the initial film will be made much more uniform in the deplating step, the non-uniformity of then initial film is less critical. Consequently the initial film may be plated on quickly via a high deposition rate. The initial film may also be plated on using only continuous forward current, or without applying any reverse current.

Where the initial film is applied via electroplating, the electroplating bath may be adapted for fast deposition, rather than for uniform deposition. The bath used for plating the initial film may be a high throwing power or high conductivity bath, in contrast to the deplating bath, which may be a low throwing power or low conductivity bath.

Throwing power is defined as the ability of a bath to produce or remove deposits of more or less uniform thickness on cathodes or anodes having macroscopic irregularities. Mathematically, it may be arbitrarily expressed as:

$$\text{Throwing Power}(TP) = \frac{\text{thickness deposited or removed in low current density region}}{\text{thickness deposited or removed in high current density region}}$$

Throwing power may be affected by bath concentrations, surface over-potential, bath conductivity, and other factors. It can also be modified by changing the chemical properties of additives and organic components in the bath. As a general rule, we define high throwing power as >0.7; and low throwing power as <0.3. In one embodiment, the metal film is deposited by plating. The plating process is performed in a first bath with high throwing power (>0.7), but then processed in a second bath with low throwing power (<0.3).

As shown in FIG. 1, in the case of through-photoresist plating in wafer level packaging applications, a substrate 10, such as a semiconductor wafer, is plated in a plating bath. A mask or photoresist 12 forms a pattern on the substrate. Electric field lines 20 in the bath cause ions, typically metal ions, to deposit onto the substrate, forming a film or layer 14 on the substrate. The pattern formed by the mask or photoresist 12 typically has a multiplicity of dense regions 16 and sparse (or relatively less dense) regions 18. The density of a region is determined by the relative areas of exposed substrate in comparison to the area of the mask or masked area of the substrate. Local electrical current distribution is affected by the local pattern density. A denser region 16, characterized by densely packed or more open features, has low current crowding, as shown by the electric field lines 20 at region 16 in FIG. 1. A sparser region 18, characterized by sparse or more isolated features, has high current crowding, as shown by the electric field lines 20 at region 18 in FIG. 1. As current crowing at the denser region 16 is minimal, the thickness T1 of the plated film 14 at that location is less than the thickness T2 of the plated film 22 in a sparser region 18.

Figure 2:
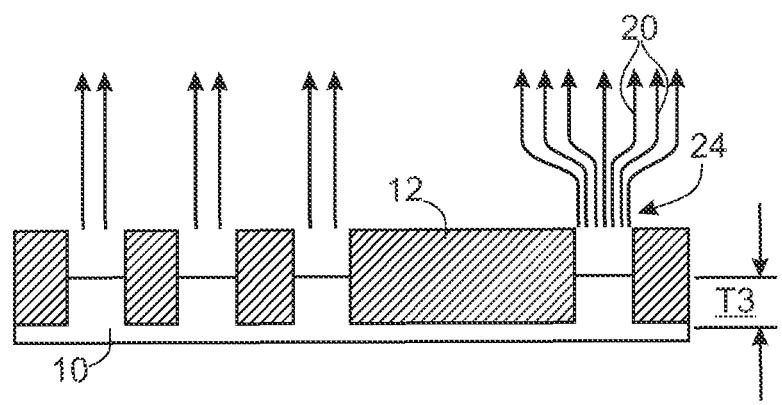
FIG. 2 is a schematic diagram of the substrate shown in FIG. 1 during deplating.

As shown in FIG. 2, deplating is also selectively influenced by current crowding. As a result, during deplating, the film 22 in the less dense or sparse region 18 is deplated at a higher rate than the film 14 in the denser region 16. After deplating, both films 14 and 22 are consequently more uniform, approaching a common or desired uniform thickness T3.

Testing demonstrates that this process can decrease WID non-uniformity of the metal film by over 60%. Further improvement can be achieved through optimization and modification of bath chemistry, pre- or post-treatment, and waveform.

Throwing power can be affected by bath conductivity, and deposition kinetics. Acid concentration can be used to change bath conductivity which then affects throwing power. A bath with low throwing power may have low acid concentration. In the case of sulfuric acid, for example, concentrations range from 0 g/L to 50 g/L, more preferably from 1 g/L to 25 g/L. In another embodiment, other ions (such as metal or simple salt) are used as the charge carrier, so that the acid concentration may be 0 g/L. In another embodiment, concentrations are selected to provide bath conductivity of 1 mS/cm to 250 mS/cm, more preferably from 10 mS/cm to 100 mS/cm. Acid may be present in forms of sulfuric acid, phosphoric acid, methanesulfonic acid, chromic acid, etc. With respect to pH, different acids and different concentrations would affect the operating range of pH. For phosphoric acid, pH may be about −1.5. For sulfuric acid, pH may be from 0.3 to 3.0. pH may also be affected by the presence of other charge carriers, such as metal ions.

Metal concentration may vary from 0 g/L to saturation level. In the case of copper, copper may be present in forms of copper sulfate, copper oxide (cuprous or cupric), copper methanesulfonic acid, etc. Concentrations of metal ions can affect gas evolution and oxide formation in the bath. Other metal ionic salt solutions containing other metals such as nickel, gold, silver, indium, palladium, cobalt, iron, tin, tin-silver, lead-tin other metals and alloys, etc., may of course be used.

The second bath can be acidic or alkaline. The deplating bath may be formulated with various chemical properties, such as viscosity, pH, for specific removal purposes or criteria. For example, the use of high viscosity components such as phosphoric acid, sulfuric acid, ethylene glycol or polyethylene glycol may alter the physical and chemical properties of the bath to inhibit undesirable characteristics such as side-wall erosion, or to promote desirable characteristics such as reducing surface roughness. Other bath components may be used: methanesulfonic acid, hydroxyethylidenediphosphonic acid (HEDP), sodium tripolyphosphate (Na5P3O10), sodium/potassium nitrate (NaNO3/KNO3), nitric acid, chromic acid, copper oxide, alcohol, etc. Bath choices may also be selected based on the nature of the metal. For example, conventional electro-polishing niobium may use a bath that includes hydrofluoric acid. Therefore, after selecting a second bath with the desirable properties, the methods described may be used for improving feature shape, surface morphology, or texture.

Additives may be included into the deplating bath to improve the quality of the process or supplement desirable chemical properties. Specifically, additives such as corrosion inhibitors such as benzotriazole (BTA) and its variants may be used to minimize corrosion of metal films such as copper. Conventional electroplating bath additives commonly referred to as halogens (ex. chlorine), suppressors, accelerators, levelers, inhibitors and brighteners may also be used to promote desirable film characteristics. Other common electropolishing additives such as acetic acid, benzoic acid, citrazinic acid, citric acid, glycerol, ethylene glycol, alcohol (such as methanol, ethanol), surfactants may be used to improve chemical properties such as copper dissolution rate, wetting, pH stability or reducing sludge formation.

Plating rate is theoretically limited by the limiting current density, which is the maximum current density at which all metal ions are reacted (surface metal concentration is 0). At above the limiting current density, undesirable processes other than plating may occur. While a higher plating rate leads to higher throughput in general, it may carry other negative impacts, such as worsening uniformity. Therefore, industrial production often suppresses the plating rate in order to achieve more uniform deposition. Although the methods described enable more uniform deposition, alternatively, they may be used to achieve higher overall process rate as an additional benefit while achieving the same film uniformity. Overall process rate here is defined as the final thickness divided by summation of all process times. In this application, plating rate is increased, even though it may adversely impact thickness uniformity. The substrate may be subsequently processed in a second bath with low throwing power or low conductivity to improve film uniformity. The combined result is a process that achieves higher overall process rate with reduced or no adverse effect on film uniformity.

Different sequencing, such as plating, then deplating, and then back to repeating the cycles of plating and/or deplating may be deployed as a fine-tuning technique.

Different waveforms, such as reverse pulsing or pulse forward can be applied during deplating. For example, using short forward pulses during deplating may reverse temporarily or lessen the gas evolution at the inert cathode surface. Forward current may also temporarily reduce metal oxide present at the substrate surface. Another example forward current is used in an electrolyte containing metal to deposit a thin layer of metal or refine the substrate roughness introduced during deplating Different duty cycle and frequency of waveforms can be used to modulate the boundary or anodic layer as well. Changing the peak current density can be used to affect the degree of preferential etch, and grain size and surface finish on the resultant film. For example, using the same bath, substrate and amp-time, higher current density tends to improve such selectivity. Electrical current can be applied in current-controlled mode, voltage-controlled mode or a combination of both modes. Depending on settings, certain bath choices may be used for both electro-etching in current-controlled mode, and electro-polishing in voltage-controlled mode. In one embodiment, using phosphoric acid, electro-etch is performed in current-controlled mode within the linear regime, and then followed by electro-polish in voltage-controlled mode within the limiting current regime.

The process can also be supplemented with a wet etch or clean process pre- or post-deplate. Prior to electro-etching, substrate may be pre-treated, for example by using an alkaline pre-cleaning, a mild acid dip or rinse, or a dilute surfactant rinse. After electro-etching, the substrate may be post-treated with alkaline or an acid dip/rinse.

The second bath can be single-use chemistry or multi-use chemistry. A bleed-and-feed system may also be employed to extend the use of bath for longer bath life.

In one embodiment, separate reactor chambers may be employed, with a first chamber with first bath used for electro-plating the metal layer, and a second chamber with a second bath used for electro-etching the metal layer. In another embodiment, a third bath may be optionally used for electro-polishing. In another embodiment, electroplating and electro-etching and/or electro-polishing may be carried out in the same reactor chamber, while still using multiple chemical baths, by changing out the first bath and replacing it with a second bath. In another embodiment, the substrate may be exposed to the second bath after a change of substrate position and/or hardware configuration even within the same chamber.

The patterned conductive metal film may be deposited by processing in a first bath with high throwing power (such as a low copper, high acid bath for copper deposition). Low throwing power is conventionally not a desirable bath property for plating uniformly, but may be desirable for other reasons or circumstances, such as allowing higher metal concentration, or reducing acid attack on resist. In one embodiment, a metal film is first deposited in a low throwing power bath. The metal film is then exposed to another low throwing power bath (different formulation) for the metal removal process to achieve further uniformity improvement.

While chemical properties of the first bath are typically selected to be different than the chemical properties of the second bath, under certain cases, they can be the same; or the two baths can be the same bath. A previous embodiment demonstrates plating the substrate in first chamber with first bath, and then deplating the substrate in second chamber with second bath. In another embodiment, the first bath and the second bath have the same formulation; the plating and deplating are performed in separate first and second chambers. In another embodiment, the first bath and the second bath are together the same bath; the difference is that one of the baths is treated or filtered as opposed to the other bath, in order to limit or remove degradation byproducts resulting from reverse polarity processing. In another embodiment, the first bath and the second bath are the same bath with no difference between the two. For instance, the substrate is first plated at a low plating rate to promote low stress and a uniform deposit, and then subsequently processed at a high deplating rate to improve uniformity.

The cathode material used in plating can be a consumable metal cathode or an inert material.

The methods described may also be used for selective metal removal, by processing with the appropriate current density, process time, bath properties. In one embodiment, more thickness in the sparse regions than thickness in the dense regions may be removed in a low acid bath by simply increasing process time or current density. The end result is that the thickness in the sparse regions becomes thinner than the thickness in the dense regions; up to complete thickness removal in the sparse regions.

After electrodeposition, through-silicon via (TSV) commonly may have a protrusion over the filled vias and over-burden on top of the seed layer which requires planarization or etch back. The protrusions may be reduced or removed via the deplating methods described above, in a deplating step that deplates metal from the protrusions faster than from surrounding areas. The more uniform metal film remaining after deplating requires less chemical mechanical polishing.

In one embodiment, the substrate is electro-polished in phosphoric acid to reduce the over-burden thickness and increase film planarity. Other substances besides phosphoric acid such as dilute phosphoric acid, ethylene glycol, sodium tripolyphosphate, sulfuric acid, HEDP, copper oxide, or combinations of the above may be used. By manipulating current distribution and mass transfer, under-metal seed and barrier may be removed with further processing.

Thus, novel methods have been described. Various changes and substitutions may of course be made without departing from the spirit and scope of the invention. The invention, therefore, should not be limited except by the following claims and their equivalents.

The invention claimed is:

1. A method for plating a substrate, comprising:
   providing the substrate comprising a low current density crowding region and a high current density crowding region;
   moving the substrate into a first bath having a first throwing power greater than 0.7;
   conducting electric current at a first polarity through the first bath to deposit an initial layer onto the substrate, wherein the initial layer has at least 3% non-uniformity between the thickness of material deposited in the low current density crowding region versus the thickness of material deposited in the high current density crowding region on the substrate;
   moving the substrate into a second bath having a throwing power of 0.3 or less;
   wherein throwing power is equal to a layer thickness deposited or removed in the low current density crowding region/a layer thickness deposited or removed in the high current density crowding region;
   conducting electric current at a second polarity, opposite the first polarity, through the second bath to partially deplate the initial layer, wherein the partial deplating in the second bath removes the initial layer at the high current crowding density region faster than at the low current crowding density region such that the initial non-uniformity is reduced by at least 30%.

2. The method of claim 1 wherein the second bath has a throwing power of 0.3 to 0.1.

3. The method of claim 1 wherein the second bath has bath conductivity between 1 to 250 mS/cm.

4. The method of claim 3 wherein the second bath has bath conductivity between 10 to 100 mS/cm.

5. The method of claim 4 with the substrate having a photoresist or mask layer.

6. The method of claim 5 wherein the initial layer thickness is deplated by at least 10%.

7. The method of claim 1 with the first bath in a first processing chamber and the second bath in a second processing chamber, further comprising moving the substrate from the first processing chamber to the second processing chamber.

8. The method of claim 1 further comprising removing the substrate from the first bath and exposing it to the second bath all within the same processing chamber.

9. A method for plating a patterned substrate to reduce within-die non-uniformity of a metal film plated onto the patterned substrate, comprising:
   moving the patterned substrate into a first bath having a first throwing power greater than 0.7, with the patterned substrate having a low current density crowding region and a high current density crowding region;
   conducting electric current at a first polarity through the first bath to deposit an initial layer onto the patterned substrate, wherein the initial layer has at least 3% non-uniformity between the thickness of material deposited in the low current density crowding region versus the thickness of material deposited in the high current density crowding region on the patterned substrate;
   moving the patterned substrate into a second bath having a throwing power of 0.3 or less;
   wherein throwing power is equal to a layer thickness deposited or removed in the low current density crowding region/a layer thickness deposited or removed in the high current density crowding region;
   conducting electric current at a second polarity, opposite the first polarity, through the second bath to partially and non-uniformly deplate the initial layer, wherein the partial deplating in the second bath removes the initial layer at the high current crowding density region faster than at the low current crowding density region such that the initial non-uniformity is reduced by at least 30%.

10. The method of claim 9 wherein the second bath has a throwing power of 0.3 to 0.1.

11. The method of claim 9 wherein the second bath has bath conductivity between 1 to 250 mS/cm.

12. The method of claim 11 wherein the second bath has bath conductivity between 10 to 100 mS/cm.

13. The method of claim 9 wherein the initial layer thickness is deplated by at least 10%.

14. The method of claim 9 with the first bath in a first processing chamber and the second bath in a second processing chamber, further comprising moving the substrate from the first processing chamber to the second processing chamber.

15. The method of claim 9 further comprising removing the substrate from the first bath and exposing it to the second bath all within the same processing chamber.

* * * * *